United States Patent [19]
Vatinel

[11] Patent Number: 5,995,579
[45] Date of Patent: Nov. 30, 1999

[54] BARREL SHIFTER, CIRCUIT AND METHOD OF MANIPULATING A BIT PATTERN

[75] Inventor: Christopher Vatinel, Le Rouret, France

[73] Assignee: VLSI Technology, Inc., San Jose, Calif.

[21] Appl. No.: 08/770,624

[22] Filed: Dec. 19, 1996

[51] Int. Cl.[6] .................................................. G11C 19/00
[52] U.S. Cl. .............................. 377/69; 377/73; 377/75; 377/77
[58] Field of Search ................. 377/69, 73, 75, 377/77; 364/715.08

[56] References Cited

U.S. PATENT DOCUMENTS

| | | | |
|---|---|---|---|
| 4,149,263 | 4/1979 | Prioste | 377/69 |
| 4,491,910 | 1/1985 | Caudel et al. | 364/200 |
| 4,507,731 | 3/1985 | Morrison | 364/200 |
| 4,533,992 | 8/1985 | Magar et al. | 364/200 |
| 4,782,457 | 11/1988 | Cline | 364/715.08 |
| 4,829,460 | 5/1989 | Ito | 364/715.08 |
| 4,962,500 | 10/1990 | Nakagawa | 371/24 |
| 5,155,698 | 10/1992 | Niimi | 364/715.08 |
| 5,457,723 | 10/1995 | Murakami | 377/64 |
| 5,465,223 | 11/1995 | Nishimura | 364/715.08 |
| 5,477,477 | 12/1995 | Saitou | 364/715.08 |
| 5,526,296 | 6/1996 | Nakahara et al. | 364/715.08 |
| 5,532,949 | 7/1996 | Fujihara | 364/715.08 |
| 5,600,674 | 2/1997 | Bonet et al. | 375/244 |
| 5,646,873 | 7/1997 | Shimazawa et al. | 364/715.08 |
| 5,652,718 | 7/1997 | Thomson et al. | 364/715.08 |
| 5,671,166 | 9/1997 | Omote | 364/715.08 |
| 5,682,340 | 10/1997 | Arends et al. | 377/69 |
| 5,826,100 | 10/1998 | Bonet et al. | 395/800.33 |

*Primary Examiner*—Margaret R. Wambach
*Attorney, Agent, or Firm*—Wells, St. John, Roberts, Gregory & Matkins P.S.

[57] ABSTRACT

The present invention provides for a circuit comprising: an input operable to receive a bit pattern; a bit-operator configured to selectively transpose the bit pattern; a shifter configured to shift the bit pattern following the transposition of the bit pattern; and the bit-operator being configured to transpose the bit pattern following the shift of the bit pattern. The present invention additionally provides a barrel shifter and a method for manipulating a bit pattern.

43 Claims, 6 Drawing Sheets

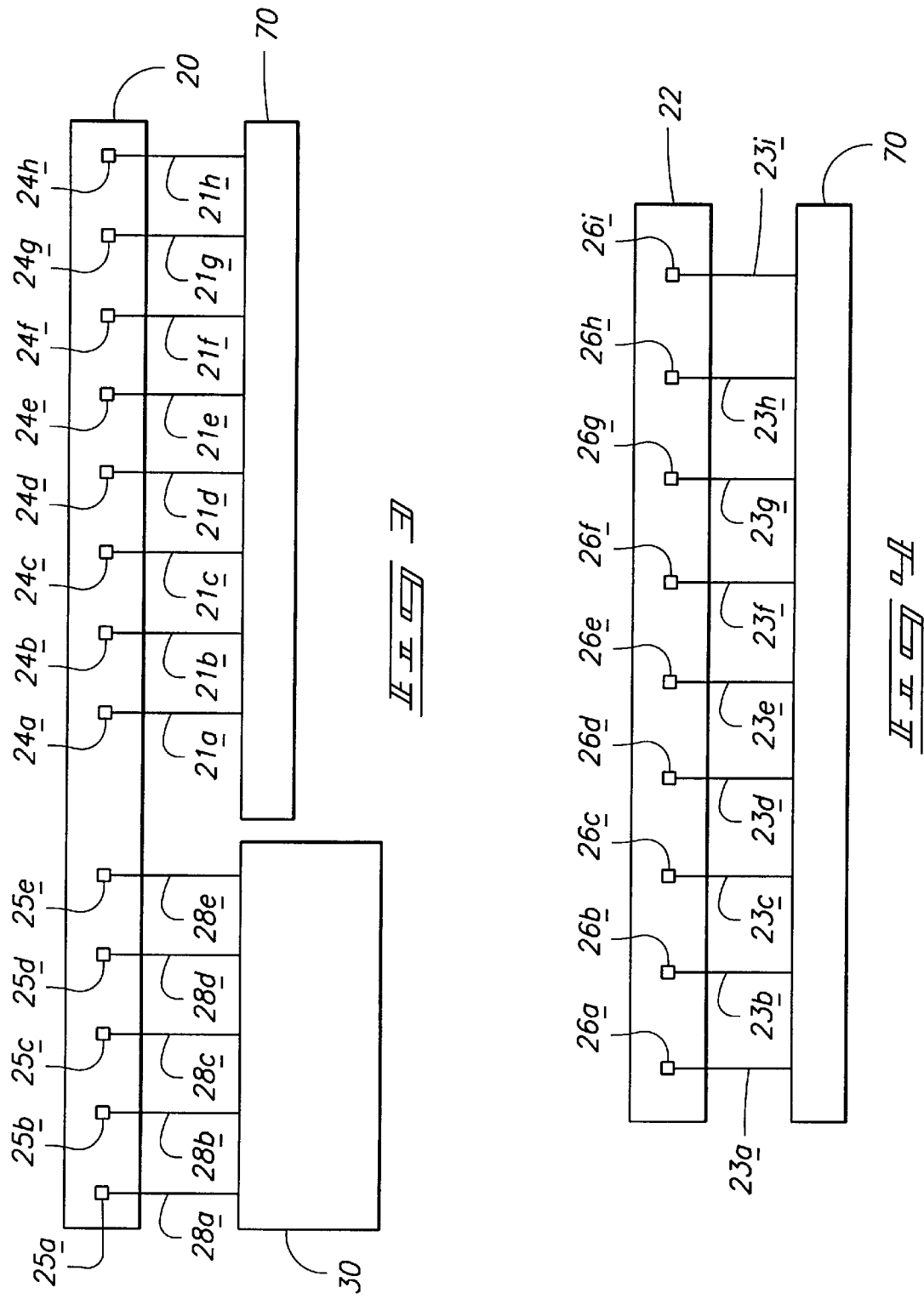

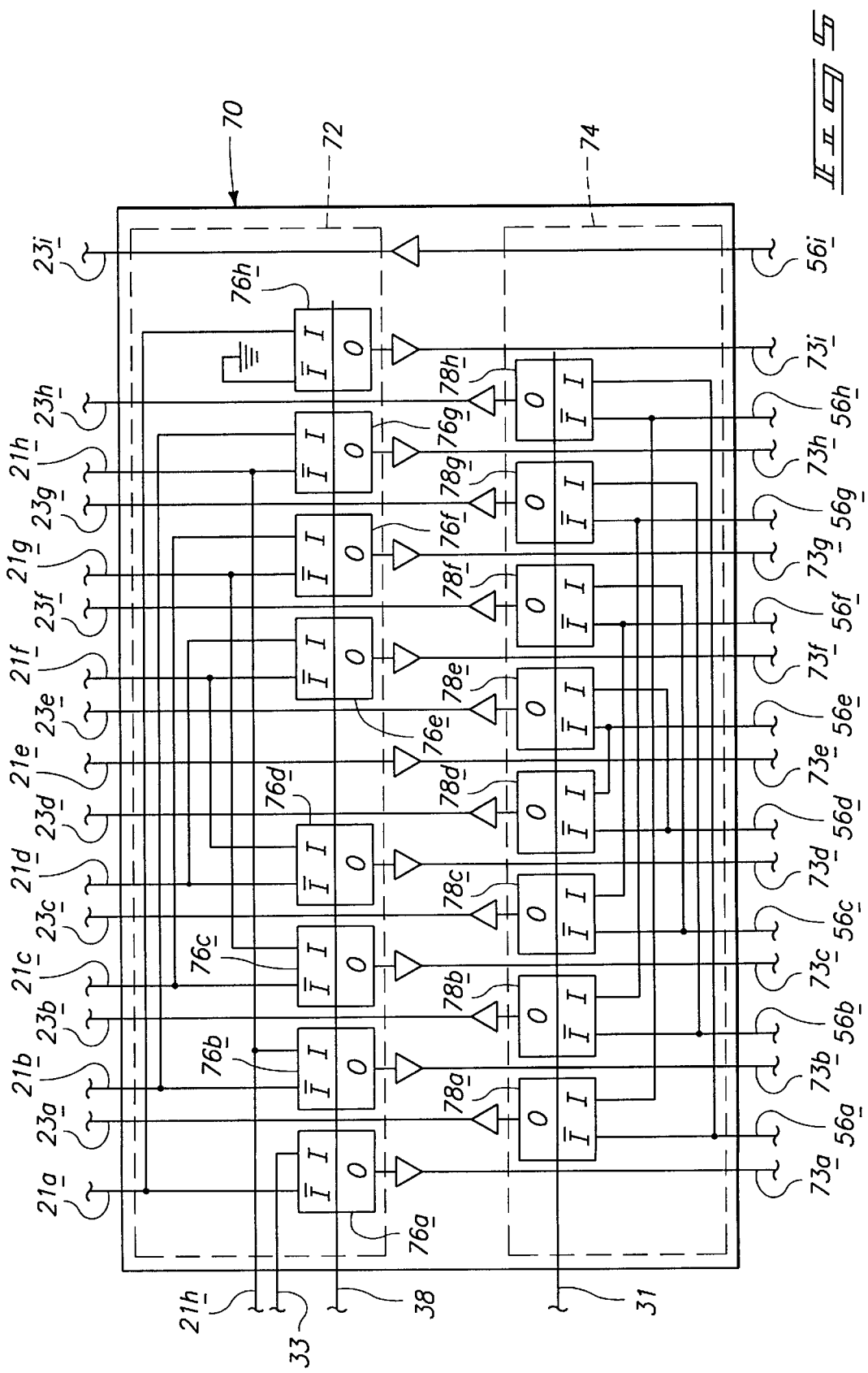

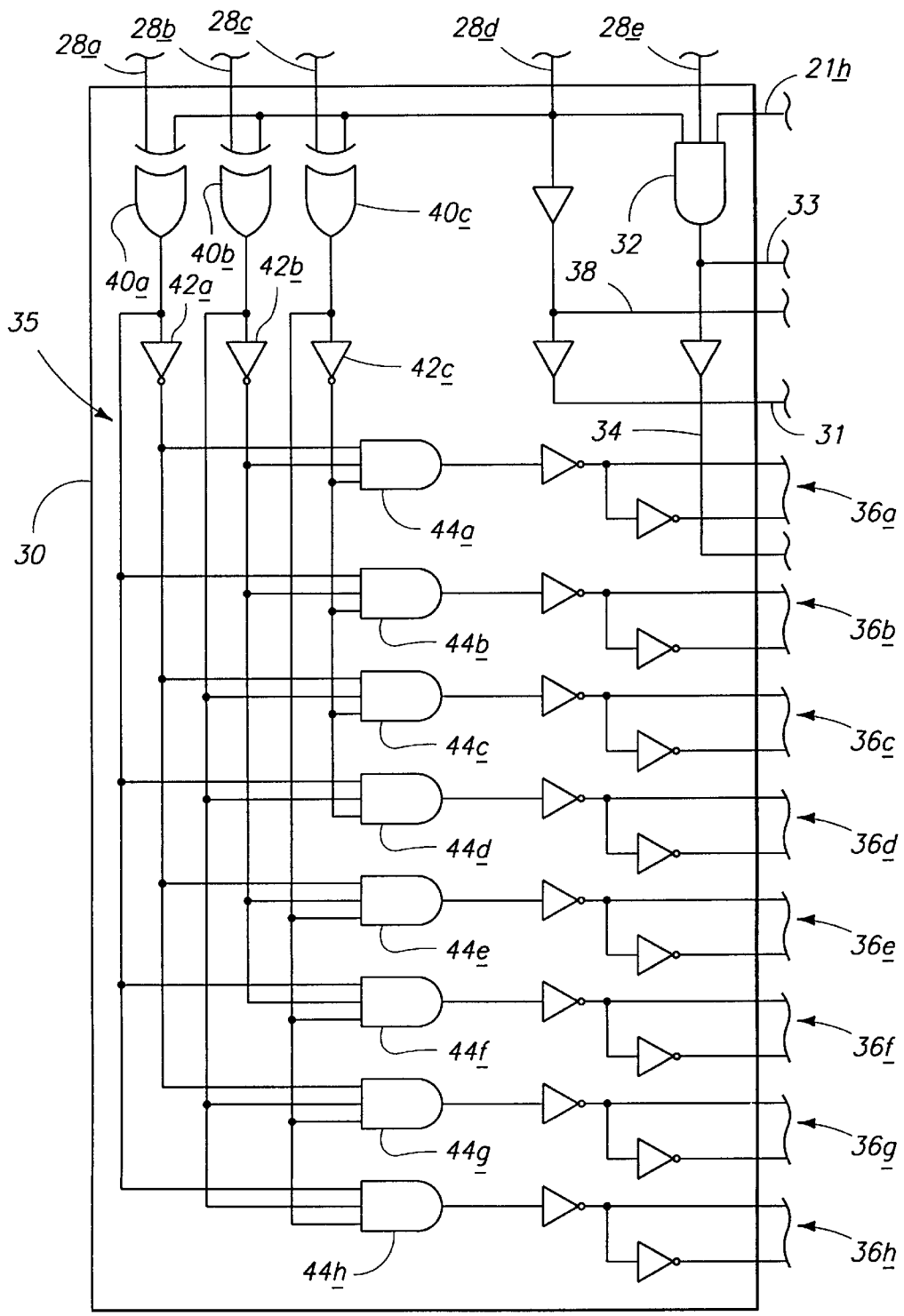

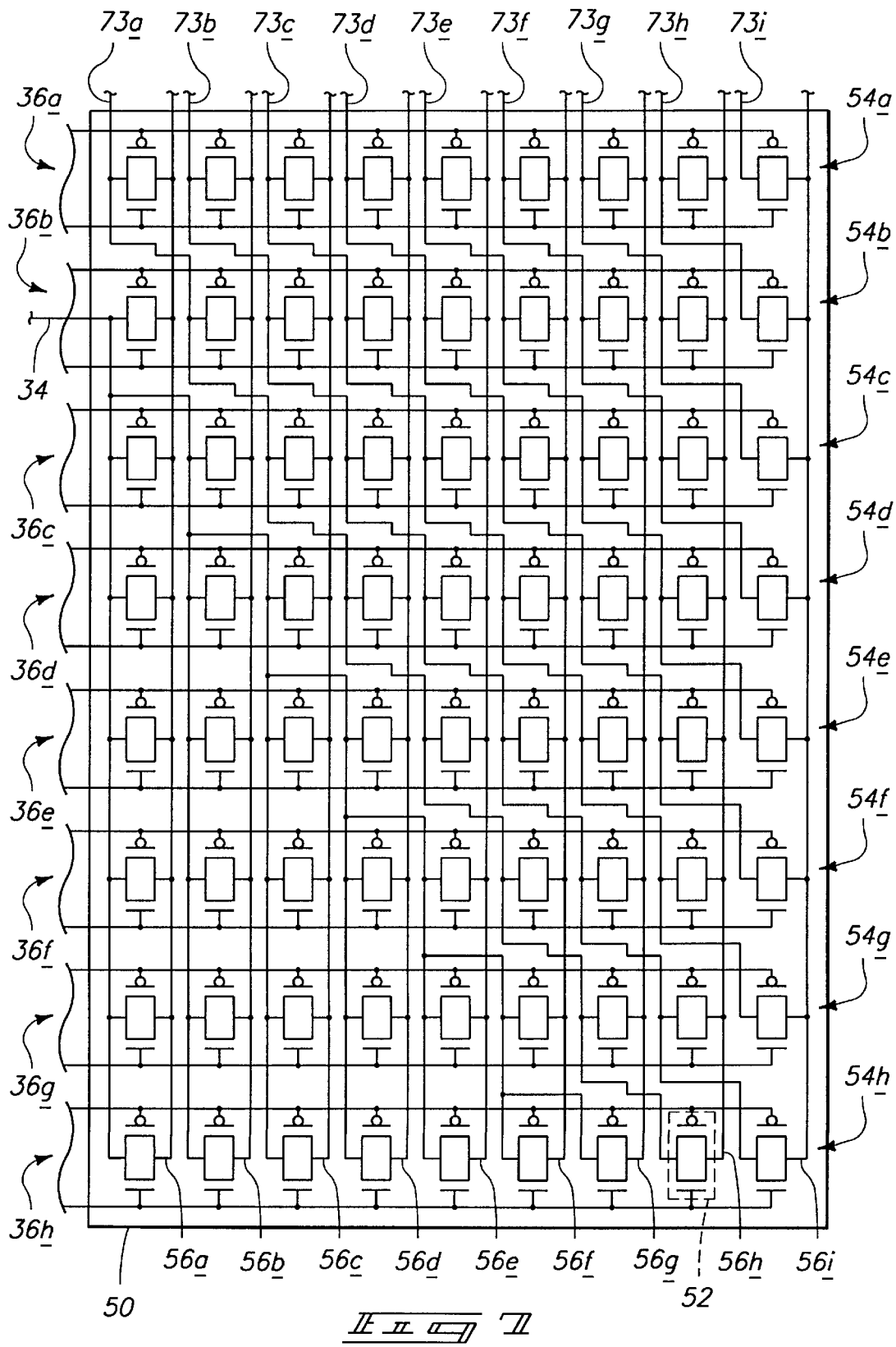

BARREL SHIFTER, CIRCUIT AND METHOD OF MANIPULATING A BIT PATTERN

TECHNICAL FIELD

The present invention relates to barrel shifters, circuits and methods of manipulating a bit pattern.

BACKGROUND OF THE INVENTION

Barrel shifters are conventional circuits which may be utilized to shift the contents of a data path of an integrated circuit, such as a microprocessor or digital signal processor. The output bit pattern of the barrel shifter may be applied to an arithmetic logic unit which provides arithmetic and logic operations thereto. A variable-length shift of a bit on the data path requires the possibility of connecting the selected bit to any one of several other bit paths.

The circuit shown in FIG. 1 comprises a classical 8-bit barrel shifter. The barrel shifter generally receives data via an input 6. The data may be shifted or rotated within the barrel shifter. An array containing passgates may be utilized to perform the shift function. The classical barrel shifter includes 2*d lines of m+1 passgates (d=signed shift value; m=number of bits in input and output data path). Each line includes m+1 passgates (opposed to only m) to account for the carry over bit.

A decoding section 7 may be utilized to generate a plurality of select signals from control signals received via input 6. The select signals may be applied via lines 4 to the passgate array 8. The classical barrel shifter generates 2*d select signals for providing shifting operations. In particular, the select signals enable an appropriate column of passgates to provide the desired shift of the bit pattern It is often desired to optimize the area occupied by components implemented within an integrated circuit to enable the formation of additional components thereupon. Providing additional components enables additional processing of data, faster processing of the data, as well as larger amounts of data to be processed.

Improvements in integrated circuit materials, mechanical equipment and photolithography have enabled close tolerances and small geometries to be attained. Such improvements permit the formation of additional components upon a processor.

In addition, space upon the integrated circuit may be conserved by providing components which require less surface area for implementation. Reducing the surface area required for implementing components provides additional space for providing additional components on the integrated circuit.

Therefore, there exists a need for reducing the surface area required for the implementation of a barrel shifter on an integrated circuit.

BRIEF DESCRIPTION OF THE DRAWINGS

Preferred embodiments of the invention are described below with reference to the following accompanying drawings.

FIG. 3 is a schematic diagram showing the input of the barrel shifter shown in FIG. 2.

FIG. 4 is a schematic diagram showing the data output of the barrel shifter shown in FIG. 2

FIG. 5 is a schematic diagram of a preferred embodiment of the bit-operator of the barrel shifter shown in FIG. 2.

FIG. 6 is a schematic diagram of a preferred embodiment of the barrel shifter controller of the barrel shifter shown in FIG. 2.

FIG. 7 is a schematic diagram of a preferred embodiment of the shifter of the barrel shifter shown in FIG. 2

DETAILED DESCRIPTION OF THE PREFERRED EMBODIMENTS

Figure 1:
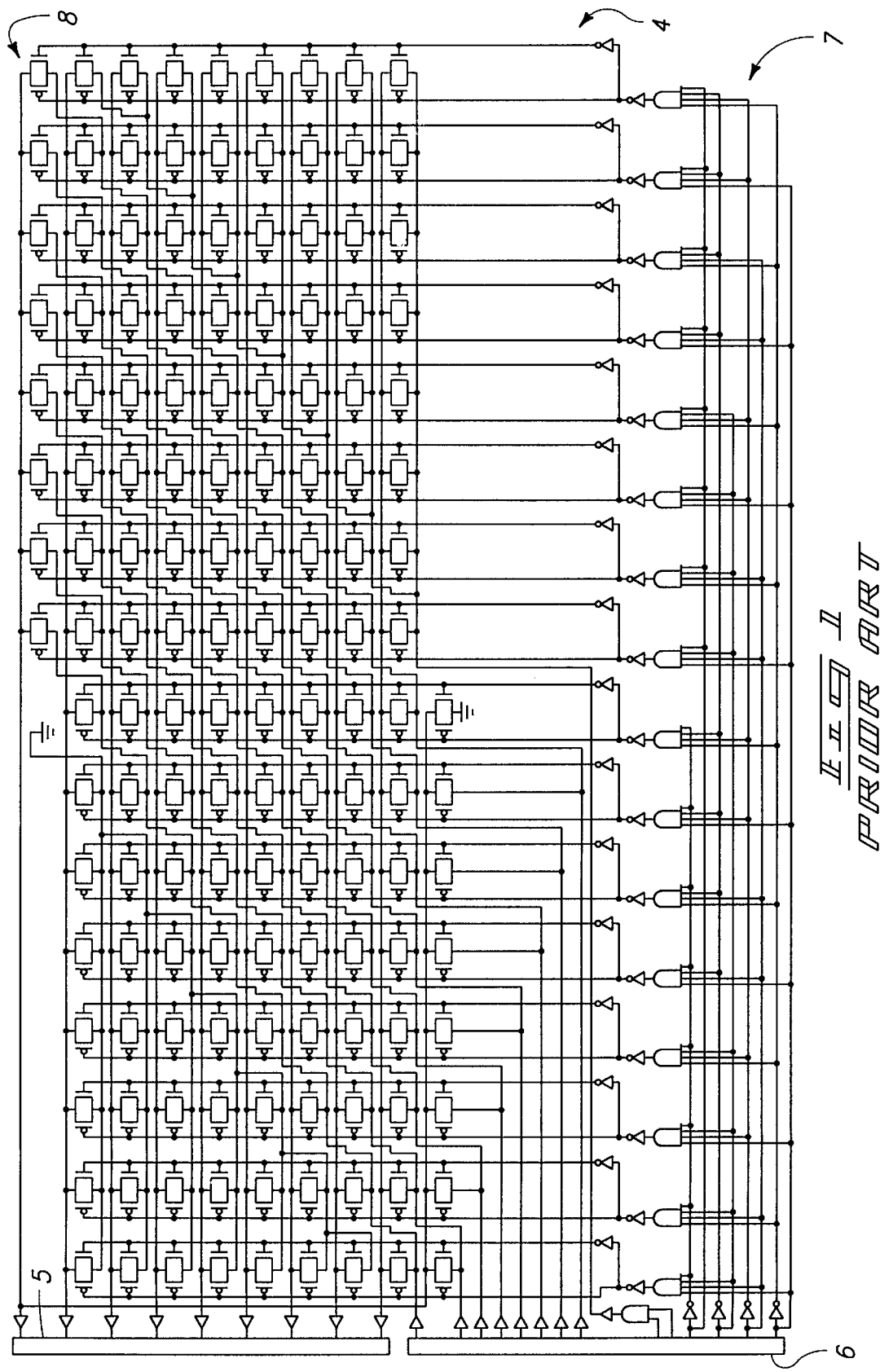
FIG. 1 is a schematic diagram of classical prior art barrel shifter architecture.

This disclosure of the invention is submitted in furtherance of the constitutional purposes of the U.S. Patent Laws "to promote the progress of science and useful arts" (Article 1, Section 8).

Barrel Shifter Generally

In a first aspect of the present invention, a circuit comprises: an input operable to receive a bit pattern; a bit-operator configured to selectively transpose the bit pattern; a shifter configured to shift the bit pattern following the transposition of the bit pattern; and the bit-operator being configured to transpose the bit pattern following the shift of the bit pattern In another aspect of the present invention, a circuit comprises: an input operable to receive a bit pattern; an input bit-reverser configured to selectively reverse the bit pattern; a shifter configured to selectively shift the bit pattern; and an output bit-reverser configured to selectively reverse the bit pattern.

In still another aspect of the present invention, a barrel shifter comprises: an input operable to receive a bit pattern; a shifter configured to selectively shift the bit pattern; at least one multiplexer electrically coupled with the shifter; and a data output operable to output the bit pattern.

In yet another aspect of the present invention, a barrel shifter comprises: an input operable to receive a bit pattern; an input bit-reverser configured to selectively reverse the bit pattern; a shifter configured to shift the bit pattern subsequent to the reversal thereof; an output bit-reverser configured to reverse the bit pattern subsequent to the shift thereof; and a data output operable to output the bit pattern.

In another aspect of the present invention, a barrel shifter configured to provide bi-directional shifting of a bit pattern comprises: an input operable to receive the bit pattern and at least one control signal; a decoder configured to generate at least one select signal responsive to the at least one control signal; an input bit-reverser configured to selectively reverse the bit pattern responsive to at least one control signal, the input bit-reverser including a plurality of input multiplexers, a shifter configured to left shift the bit pattern subsequent to the reversal thereof and responsive to at least one select signal, the shifter being configured to vary the magnitude of the shift of the bit pattern responsive to at least one select signal, the shifter and the input bit-reverser being configured to receive a sign extension signal; an output bit-reverser configured to reverse the bit pattern subsequent to the shift thereof and responsive to at least one control signal, the output bit-reverser including a plurality of output multiplexers; the shifter includes a plurality of input data lines individually connected to at least two input multiplexers and a plurality of output data lines individually connected to at least two output multiplexers; and a data output operable to output the bit pattern.

In another aspect of the present invention, a method of manipulating a bit pattern comprises the steps of: inputting a bit pattern; transposing the bit pattern; shifting the bit pattern following the transposing thereof; and transposing the bit pattern following the shifting thereof.

A preferred embodiment of the barrel shifter in accordance with this invention is described with reference to FIG. 2–FIG. 7. Such Figures show various aspects and characteristics described in detail below of the barrel shifter. The barrel shifter is generally designated with numeral 10.

The barrel shifter 10 provides both left and right shift operations of an inputted bit pattern. The barrel shifter 10 is configured to provide right shift functions of a bit pattern by performing a left shift operation on a bit-reversed input.

Figure 2:
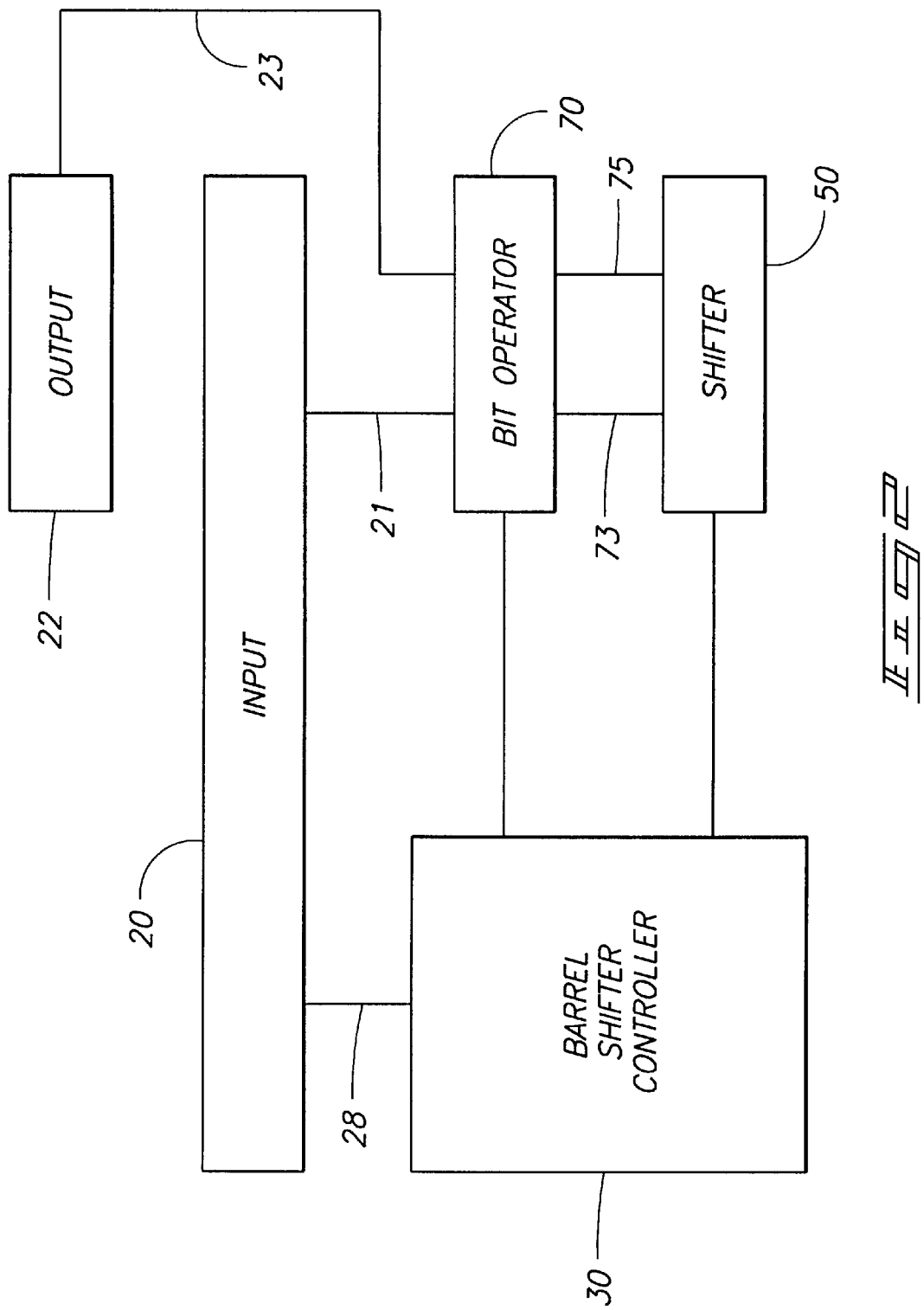
FIG. 2 is a functional block diagram of a preferred barrel shifter in accordance with the present invention.

For clarity, the embodiment of the barrel shifter 10 shown in FIG. 2 is configured to manipulate a parallel 8-bit pattern. However, it is to be understood that the barrel shifter 10 may be alternately configured to provide shift operations of other sized bit patterns.

Barrel Shifter Architecture

Referring to FIG. 2, the barrel shifter 10 comprises an input 20 and a data output 22 for receiving a bit pattern and outputting a bit pattern to a data path or other digital data transfer device. The input is generally coupled with a shifter 50 configured to provide shift operations of the bit pattern based upon a received shift value. The shifter 50 comprises an array of passgates 52 (shown in FIG. 7) which are operable to provide such shift operations. An additional embodiment of a shifter providing fast sign extension propagation is disclosed in a co-pending U.S. patent application, entitled "Barrel Shifter, Circuit and Method of Manipulating a Bit Pattern", filed the same day as the present application by the inventor hereof having Ser. No. 08/770,623 and commonly assigned to the assignee hereof, and incorporated herein by reference.

The preferred embodiment of the barrel shifter 10 provides a bit-operator 70 intermediate the input 20 and shifter 50. The bit-operator 70 includes an input bit reverser 72 and an output bit reverser 74 (components 72 and 74 are illustrated in FIG. 5) each configured to manipulate the bit pattern. In particular, the bit-operator 70 is configured to provide transposing operations, such as a bit-reversing operation, of the bit pattern in accordance with the present invention. The bit reversers 72, 74 are described in detail below with reference to FIG. 5.

Still referring to FIG. 2 . the input and output bit-reversers 72, 74 of the bit-operator 70 are each connected to the shifter 50. The shifter 50 is operable to provide manipulations of the bit pattern responsive to a plurality of control signals. The control signals are received via the input 20 and define the shift value (magnitude) and direction (left or right) of a shift of the bit pattern.

The signed shift value control signals (referred to herein as SHFT[0]–SHFT[3] and $S_0$–$S_3$) are provided to a barrel shifter controller 30 (illustrated in FIG. 3 and FIG. 6). The barrel shifter controller 30 is electrically connected to the input 20 via a plurality of control lines 28a–28e. The barrel shifter controller 30 generates a plurality of select signals for controlling the operation of the shifter 50. More specifically, the select signals are applied via a plurality of select lines 36a–36h to the shifter 50. Such signals selectively enable selected ones of the plurality of passgates 52 within the shifter 50. Following the appropriate manipulation of the bit pattern within the shifter 50 and bit-operator 70, the bit pattern is applied to the data output 22 for outputting from the barrel shifter 10.

A plurality of output data lines 56a–56i (shown in FIG. 5) connect the shifter 50 and bit-operator 70. In addition, a plurality of data lines 23a–23i (shown in FIG. 4) connect the bit-operator 70 and data output 22.

The input 20 and data output 22 may be individually coupled with a data bus. The barrel shifter 10 is configured to manipulate a bit pattern received via the input 20. or alternatively pass the bit pattern through barrel shifter 10 to the data output 22 without shifting or rotating thereof.

Turning now to FIG. 3, the input 20 generally includes a plurality of input leads 24a–24h. The input leads 24a–24h are each configured to receive a respective electrical signal from the data bus or data path. Each electric signal is generally a digital binary signal in either a logic high state (3.3–5 volts) or a logic low state (0 volts).

The barrel shifter 10 described herein is operable to manipulate an 8-bit pattern which may correspond to two hexadecimal numerals. More specifically, the digital electrical signals collectively form an input parallel bit pattern. The input bit pattern (I) may be represented herein as $I_0$–$I_7$. The input leads 24a–24h preferably receive the bit pattern in parallel from the least significant bit ($I_0$) to the most significant bit ($I_7$), respectively. In particular, the first input lead 24a receives the least significant bit (LSB) and the second input lead 24h receives the most significant bit (MSB). The bit pattern may comprise hexadecimal numerals which are shifted and rotated within the barrel shifter 10.

The input leads 24a–24h are electrically connected to the bit-operator 70 via a plurality of data lines 21a–21h, The data lines 21a–21h are configured to deliver the received bit pattern to the bit-operator 70. The input 20 additionally includes a plurality of control leads 25a–25e. The control leads 25a–25e are configured to receive a plurality of digital control signals which define the manipulation operations of the bit pattern within the barrel shifter 10

The control leads 25a–25e are electrically coupled with the barrel shifter controller 30 as shown in FIG. 3. The barrel shifter controller 30 controls the bit pattern manipulations within the barrel shifter 10 responsive to the control signals received via the control leads 25a–25e. More specifically, the control signals received via the control leads 25a–25e are utilized to control the shift operations of the bit pattern. The control signals provide the signed shift value and the type of shift of the bit pattern.

The control leads 25a–25d receive respective ones of the least significant bit (LSB) and most significant bit (MSB) of the signed shift value control signal. The signed shift value provided to the control leads 25a–25d may be in the form of a hexadecimal numeral. The individual control signals are referred to herein as SHFT[0], SHFT[1], SHFT[2] and SHFT[3] and are received by the barrel shifter 10 via control leads 25a–25d, respectively. SHFT[0],SHFT[1],SHFT[2], and SHFT[3] are equal to $S_0$–$S_k$.

The remaining control lead 25e may be utilized to provide arithmetic shift operations. A ASHFT control signal is provided to control lead 25e to define the type of shift operation. A logic shift is performed responsive to ASHFT being logic low and an arithmetic shift is performed responsive to ASHFT being logic high.

Referring to FIG. 6, the ASHFT control signal is applied via control line 28e to an AND gate 32 within the preferred embodiment of the barrel shifter controller 30 The signal received by the MSB control lead 25d and MSB input lead 24h are also applied to the AND gate 32 via respective connections 28d,21h. The AND gate 32 operates to generate a sign extension signal which is applied to the shifter 50 and bit-operator 70 via respective data lines 34,33.

The shifter 50 subsequently operates to insert the sign extension signal into the bit pattern during shifting of the bit pattern. In particular, the sign extension is inserted into the bit pattern at the LSB during a left shift operation of the bit pattern. The sign extension is during a left shift operation of the bit pattern. Conversely, the sign extension is inserted into the bit pattern at the MSB during a right shift of the bit pattern.

Prior to shifting of the bit pattern within the shifter 50, the bit pattern $I_0$–$I_7$ received via the input 20 is applied to the bit-operator 70. The bit-operator 70 is operable to selectively manipulate the bit pattern prior to the application thereof to the shifter 50 and following the application thereto In particular, the preferred embodiment of the bit-operator 70 comprises an input bit-reverser 72 and an output bit-reverser 74.

Referring now to FIG. 5, the input bit-reverser 72 is operable to provide reversing operations of the bit pattern prior to application to the shifter 50. The input bit-reverser 72 comprises a plurality of input multiplexers 76a–76h. The input multiplexers 76a–76h permit selective transposing reversing of the input bit pattern $I_0$–$I_7$. Following selective manipulation of the bit pattern within the bit-operator 70, the bit pattern is applied to the shifter 50. A plurality of input data lines 73a–73d and 73g–73i electrically couple the input multiplexers 76a–76h with the shifter 50. The $I_4$ bit of the bit pattern is applied directly to the shifter 50 from the input lead 24e via input data line 73e.

The state of the MSB of the signed shift value control signal (SHFT[3] or $S_k$) controls the operation of the input bit-reverser 72. The SHFT[3] signal is received on control lead 25d and is applied via lines 31,38 to the bit-operator 70. The state of the SHFT[3] control signal determines whether the barrel shifter 10 performs left shifting or right shifting of the bit pattern.

The preferred embodiment of the barrel shifter 10 is configured to provide left shift operations of the bit pattern when the SHFT[3] control signal is logic low. Alternately, the barrel shifter 10 is operable to provide right shift operations responsive to the SHFT[3] control signal being logic high.

The respective control lines 38,31 apply the SHFT[3] control signal to the input multiplexers 76a–76h and the output multiplexers 78a–78h of the bit-operator 70 as shown in FIG. 5 and FIG. 6. Responsive to SHFT[3] being logic low, the input multiplexers 76a–76g pass the input bit pattern $I_0$–$I_3$ and $I_5$–$I_7$ to the input data lines 73a–73d and 73f–73i, respectively. Bit $I_4$ of the bit pattern is applied via data line 73e to the shifter 50.

The order of the bit pattern is not reversed when the SHFT[3] control signal is logic low. The input leads 24a–24d, 24f–24h are coupled with the left input of the input multiplexers 76a–76g, respectively. The left input of multiplexer 76h is connected to ground. The left input of each input multiplexer 76a–76h is enabled responsive to the SHFT[3] control signal being logic low. The input bit-reverser 72 passes the bit pattern as received to the shifter 50 without reversal or transposition thereof in response to the SHFT[3] control signal being logic low.

The input leads 24a–24d,24f–24h are also coupled with a right input of respective input multiplexers 76h–76b to provide transposing of the bit pattern prior to application to the shifter 50. The right input of input multiplexer 76a receives the sign extension output on data line 33 from AND gate 32. If the SHFT[3] control signal is logic high, the input multiplexers 76b–76h perform a transpose operation of the bit pattern, A logic high SHFT [3] control signal enables the right inputs of the input multiplexers 76a–76h.

More specifically, input multiplexer 76h passes the LSB of the bit pattern ($I_0$) received on input lead 24a to input data lead 73i and the shifter 50 Similarly, multiplexer 76g passes the signal received on input lead 24b, multiplexer 76f passes the signal received on input lead 24c, multiplexer 76e passes the signal received on input lead 24d, multiplexer 76d passes the signal received on input lead 24f, multiplexer 76c passes the signal received on input lead 24g and multiplexer 76b passes the signal received on input lead 24h. Multiplexer 76a passes the sign extension signal via input data lead 73a to the shifter 50.

The signal received via input lead 24e (bit $I_4$) is not transposed responsive to SHFT[3] being logic high. The signal received via input data lead 24e is applied directly to a buffer via data line 21e. Thereafter, the $I_4$ bit is applied to the shifter 50 via input data line 73e.

The first multiplexer 76a is operable to pass the sign extension received via line 33 to the shifter 50 responsive to the SHFT[3] control signal being logic high. In addition, multiplexer 76h passes a logic low signal responsive to the SHFT[3] control signal being logic low. The output of the input multiplexers 76a–76h are buffered, and thereafter applied to the shifter 50 via input data lines 73a–73d and 73f–73i.

The shifter 50 comprises a plurality of passgates 52 arranged in an array configuration. For purposes of discussion herein, the horizontal rows 54a–54h thereof are sequentially labeled. The horizontal rows 54a–54h are selectively enabled responsive to the signed shift value control signals SHFT[0]–SHFT[3] received via control lines 28a–28d shown in FIG. 6. Selecting a certain row 54 of passgates provides a left shift of the bit pattern of a predetermined magnitude or value, responsive to the signed shift value control signals SHFT[0]–SHFT[3]

For example, the first row 54a of passgates 52 is selected responsive to the control signals SHFT[3],SHFT[2],SHFT[1],SHFT[0] all being logic low or logic high. Enabling the first row 54a of passgates 52 provides zero shift of the bit pattern. The second row 54b of passgates 52 is selected responsive to the control signals SHFT[3],SHFT[2],SHFT[1],SHFT[0] being 0,0,0,1, respectively 1,1,1,0, respectively. Enabling the second row of passgates 52 provides a left shift (of a magnitude or shift value of 1) of the bit pattern received via the input data lines 73a–73h.

The eighth row 54h of passgates is selected responsive to the control signals SHFT[3],SHFT[2],SHFT[1],SHFT[0] being 0,1,1,1, respectively or 1,0,0,0, respectively. Selecting the eighth row 54h of passgates 52 provides a left shift (of a magnitude or shift value of 7) of the bit pattern received via the input data lines 73a–73h.

It follows that the magnitude or value of the shift provided by the preferred embodiment of the shifter 50 shown in FIG. 7 is increased corresponding to the shift value control signals SHFT[2],SHFT[1],SHFT[0] being increased from 0,0,0 to 1,1,1 when SHFT[3] is logic low and decreased from 1,1,1 to 0,0,0 when SHFT[3] is logic high. In particular, the magnitude or value of the shift is increased by 1 responsive to a next, lower row 54 of passgates 52 being selected.

The barrel shifter controller 30 is configured to selectively enable the horizontal rows 54a–54h of passgates 52 responsive to the shift value control signals SHFT[3],SHFT[2], SHFT[1],SHFT[0] received by control lines 28d–28a, respectively. The barrel shifter controller 30 shown in FIG. 6 applies the control signals SHFT[3],SHFT[2],SHFT[1], SHFT[0] to a decoder 35. The decoder 35 generates the appropriate select signals which may be applied via select lines 36a–36h to the shifter 50 for controlling the operation thereof.

The preferred embodiment of the decoder 35 includes a plurality of exclusive (XOR) gates 40a–40c. The SHFT[0]–SHFT[2] control signals are applied via respective control lines 28a,28b,28c to the first input lead of a corresponding exclusive (XOR) gate 40a,40b,40c. In addition, the MSB (SHFT[3]) of the shift value control signal is applied via control lead 28d to the second input lead of each XOR gate 40a–40c.

The output of the XOR gates 40a–40c is inverted by respective inverters 42a,42b,42c to provide complementary output signals. The inverted and noninverted output signals from the XOR gates 40a–40c are provided to a bank of AND gates 44a–44h within the decoder 35 configuration. The AND gates 44a–44h generate select signals which are utilized to enable a respective horizontal row 54a–54h of passgates 52. The select signals may be inverted to provide a plurality of pairs of complementary select signals for selecting the appropriate row 54a–54h of passgates. The pairs of select signals are applied via the paired select lines 36a–36h to the shifter 50.

Following the shifting of the bit pattern within shifter 50, the bit pattern is applied to the output bit-reverser 74 within the bit-operator 70. The passgates 52 are coupled with a plurality of output data lines 56a–56h. The output data lines 56a–56h electrically connect the output of the passgates 52 with the output multiplexers 78a–78h The output data lines 56a–56h are connected with the left input of the output multiplexers 78a–78h, respectively. Output data line 56i provides the carry over bit to output data lead 26i within the data output 22.

The output data lines 56a–56h are also coupled with the right input of the output multiplexers 78h–78a, respectively. Similar to the connections of the input leads 24a–24d, 24f–24h to the input multiplexers 76a–76h, such coupling of the output data lines 56a–56h to the output multiplexers 78h–78a enables selective transposing and reversing operations of the bit pattern.

Responsive to the shift value control signal SHFT[3], the output multiplexers 78a–78h control the data applied to the output data leads 26a–26h via data lines 23a–23h, respectively. The right inputs are enabled responsive to the shift value control signal SHFT[3] being logic high. If the shift value control signal SHFT[3] is logic low, the left inputs are enabled.

In particular, the output multiplexers 78a–78h apply the output signals on lines 56a–56h to the output data leads 26a–26h, respectively, if SHFT[3] is logic low. Conversely, if SHFT[3] is logic high, the output multiplexers 78a–78h apply the output signals on lines 56a–56h to the output data leads 26h–26a, respectively. Therefore, the output bit-reverser 74 functions to transpose (reverse) the bit pattern responsive to the shift value control signal SHFT[3] being logic high.

The output 22 receives the binary output from the bit-operator 70. The parallel output data leads 26a–26h correspond to the LSB-MSB of the binary bit pattern, respectively. An additional carry output data lead 26i is provided within the output 22 to output the CO bit. The carry output is the first lost bit from the shift operation of the bit pattern. The output 22 is configured to provide the bit pattern on output data leads 26a–26h. The bit pattern may be subsequently applied to the data bus or other component operable to receive the output of the barrel shifter 10.

Barrel Shifter Operation

In general, the barrel shifter 10 according to the present invention enables right shift functions of a bit pattern to be performed by performing a left shift operation on a bit-reversed input. A bit pattern (of m bits) inputted into the barrel shifter 10 according to the present invention may be represented as:

$$I = i_{m-1} \ldots i_0$$

wherein $i_{m-1}$ is the most significant bit (MSB) and $i_0$ is the least significant bit (LSB). The $i_{m-1}$ bit is referred to herein as $I_7$ inasmuch as the embodiment of the barrel shifter 10 shown is configured to manipulate a bit pattern of eight bits. The input leads 24a–24h each receive a respective bit $i_0$–$i_7$ of the bit pattern.

The output of the barrel shifter 10 may be represented as:

$$Z = z_{m-1} \ldots z_0$$

wherein $z_{m-1}$ ($z_7$) is the MSB and $z_0$ is the LSB. The output leads 26a–26h each output a respective bit $z_0$–$z_7$ of the bit pattern, The signed shift value control signals SHFT[3],SHFT[2], SHFT[1],SHFT[0] correspond to $S_k \ldots S_0$. SHFT is the signed shift value from –d to d–1 (k+1) bits. A positive shift value (SHFT[3], $S_k$=0) provides a left shift of the bit pattern while a negative shift value (SHFT[3], $S_k$=1) defines a right shift of the bit pattern.

The sign extension(s) may be defined as:

$$s = i_{m-1} \text{ \& ASHFT \& } S_k.$$

The input data lines 73a–73i of the shifter 50 may be defined as:

$$J_0 - J_8.$$

Responsive to $S_k$ being logic low, indicating a left shift of the bit pattern, $J = 0, i_{m-1}, \ldots i_1, i_0$. Therefore, the input data lines 73i–73a are also 0, $i_{m-1}, \ldots i_1, i_0$, respectively. Responsive to $S_k$ being logic high, indicating a right shift of the bit pattern, $J = i_0, i_1 \ldots i_{m-1}, s$. Again, it follows that the input data lines 73i–73a are also $i_0, i_1 \ldots i_{m-1}$, The positive shift value 'w' may be defined as $S_{k-1} \ldots S_0$ for a left shift ($S_k$=0); and $S_{k-1} \ldots S_0$ for a right shift ($S_k$=1), for k bits, unsigned.

The output data lines 56a–56i of the shifter 50 may be defined as:

$$Y_0 - Y_8.$$

The result of a sign-extended shift of J by the value 'w' provides:

$Y = j_{m-w}, j_{m-w-1} \ldots j_0, s, \ldots s$ (stuffed with w 's').

Another definition may be made wherein v is equal to the absolute value of the signed shift value SHFT.

When SHFT=0: w=0 and Y=0, $i_{m-1}, i_{m-2}, \ldots i_1, i_0$.

When SHFT>0: w=v and $Y = i_{m-v}, i_{m-v-1}, \ldots i_1, i_0, 0 \ldots 0$.

When SHFT<0: w=–SHFT–1=v–1 and:

$Y = j_{m-w}, j_{m-w-1}, \ldots j_1, j_0, s, \ldots, s$ $Y = i_w, i_{w-1}, \ldots, i_{m-1}, s, s, \ldots, s$ and w+1=v and LSBs equal to s.

It follows that the output of the barrel shifter can be defined as:

when $S_k$=0, $Z = y_{m-1}, y_{m-2}, \ldots, y_2, y_1, y_0$;

when $S_k$=1, $Z = y_0, y_1, y_2, \ldots, y_{m-2}, y_{m-1}$.

In either case the carry over bit (CO) is equal to $y_m$.

The barrel shifter 10 according to the present invention includes 2 lines of m 2-input multiplexers (m input multiplexers 76 and m output multiplexers 78). A decoder 35 implemented within the barrel shifter controller 30 is provided to generate the select signals (d signals). Furthermore, the shifter 50 is provided with an array of d lines of m+1 passgates 52.

The novel barrel shifter 10 includes an array area of passgates 52 which ideally has the number of passgates reduced by a factor of 2, Such a barrel shifter 10 provides increased benefits as the size of the bit pattern increases. In particulars the barrel shifter 10 provides an array of passgates 52 which requires half the array area of conventional barrel shifters. The array of passgates 52 within the preferred embodiment of the barrel shifter 10 according to the present invention also provides array capacitances which are reduced by a factor of 2.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A circuit comprising:
   an input operable to receive a bit pattern;
   a bit-operator configured to selectively transpose the bit pattern; and
   a shifter configured to shift the bit pattern following the transposition of the bit pattern, the shifter being further configured to vary the magnitude of the shift of the bit pattern responsive to at least one control signal, the bit operator being configured to selectively transpose the bit pattern following the shift of the bit pattern.

2. The circuit according to claim 1 wherein the bit-operator comprises an input bit-reverser and an output bit-reverser.

3. The circuit according to claim 2 wherein the input bit-reverser comprises at least one input multiplexer and the output bit-reverser comprises at least one output multiplexer.

4. The circuit according to claim 2 wherein the shifter includes a plurality of input data lines individually connected to at least two input multiplexers and a plurality of output data lines individually connected to at least two output multiplexers.

5. The circuit according to claim 1 wherein the shifter is configured to provide a left shift operation of the bit pattern.

6. The circuit according to claim 1 further comprising a decoder configured to operate the shifter and bit-operator responsive to at least one control signal.

7. The circuit according to claim 1 wherein at least one of the shifter and the bit-operator is configured to provide a sign extension signal into the bit pattern.

8. A circuit comprising:
   an input operable to receive a bit pattern;
   a bit-operator configured to selectively transpose the bit pattern;
   a shifter configured to shift the bit pattern following the transposition of the bit pattern, the bit-operator being configured to selectively transpose the bit pattern following the shift of the bit pattern, and at least one of the shifter and the bit-operator being configured to provide a sign extension signal into the bit pattern.

9. The circuit according to claim 8 wherein the bit-operator comprises an input bit-reverser and an output bit-reverser.

10. The circuit according to claim 9 wherein the input bit-reverser comprises at least one input multiplexer and the output bit-reverser comprises at least one output multiplexer.

11. The circuit according to claim 10 wherein the shifter includes a plurality of input data lines individually connected to at least two input multiplexers and a plurality of output data lines individually connected to at least two output multiplexers.

12. The circuit according to claim 8 wherein the shifter is configured to provide a left shift operation of the bit pattern.

13. The circuit according to claim 8 further comprising a decoder configured to operate the shifter and bit-operator responsive to at least one control signal.

14. The circuit according to claim 8 wherein the shifter is configured to vary the magnitude of the shift of the bit pattern responsive to at least one control signal.

15. The circuit according to claim 8 wherein the shifter and the bit-operator are individually configured to provide the sign extension signal into the bit pattern.

16. A circuit comprising:
   an input operable to receive a bit pattern;
   an input bit-reverser configured to selectively reverse the bit pattern;
   a shifter configured to selectively shift the bit pattern, the shifter being further configured to vary the magnitude of the shift of the bit pattern responsive to at least one control signal; and
   an output bit-reverser configured to selectively reverse the bit pattern.

17. The circuit according to claim 16 wherein at least one of the shifter and the input bit-reverser is configured to provide a sign extension signal into the bit pattern.

18. The circuit according to claim 16 wherein the shifter and the input bit-reverser are individually configured to provide a sign extension signal into the bit pattern.

19. The circuit according to claim 16 wherein the shifter is configured to provide a left shift operation of the bit pattern.

20. The circuit according to claim 16 further comprising a decoder configured to operate the shifter and bit-operator responsive to at least one control signal.

21. The circuit according to claim 16 wherein the input bit-reverser comprises at least one input multiplexer and the output bit-reverser comprises at least one output multiplexer.

22. The circuit according to claim 21 wherein the shifter includes a plurality of input data lines individually connected to at least two input multiplexers and a plurality of output data lines individually connected to at least two output multiplexers.

23. A barrel shifter comprising:
   an input operable to receive a bit pattern;
   at least one input multiplexer electrically coupled with the input and configured to transpose the received bit pattern;
   a shifter electrically coupled with the at least one input multiplexer and configured to selectively shift the bit pattern;
   at least one output multiplexer electrically coupled with the shifter and configured to transpose the shifted bit pattern; and
   a data output electrically coupled with the at least one output multiplexer and operable to output the bit pattern, at least one of the at least one input multiplexer and the shifter being configured to provide a sign extension signal into the bit pattern.

24. The barrel shifter according to claim 23 wherein the multiplexers are operable to selectively bit-reverse the bit pattern.

25. The barrel shifter according to claim 23 wherein the shifter is configured to provide a left shift operation of the bit pattern.

26. The barrel shifter according to claim 23 further comprising a decoder configured to operate the shifter and at least one multiplexer responsive to at least one control signal.

27. A barrel shifter comprising:

an input operable to receive a bit pattern;

an input bit-reverser configured to selectively reverse the bit pattern;

a shifter configured to shift the bit pattern subsequent to the reversal thereof, the shifter being further configured to vary the magnitude of the shift of the bit pattern responsive to at least one control signal;

an output bit-reverser configured to reverse the bit pattern subsequent to the shift thereof; and a data output operable to output the bit pattern.

28. The barrel shifter according to claim 27 wherein the shifter is configured to provide a left shift operation of the bit pattern.

29. The barrel shifter according to claim 27 further comprising a decoder configured to operate the shifter and input bit-reverser and output bit-reverser responsive to at least one control signal.

30. The barrel shifter according to claim 27 wherein at least one of the shifter and the input bit-reverser is configured to provide a sign extension signal into the bit pattern.

31. The barrel shifter according to claim 27 wherein the input bit-reverser comprises at least one input multiplexer and the output bit-reverser comprises at least one output multiplexer.

32. The barrel shifter according to claim 31 wherein the shifter includes a plurality of input data lines individually connected to at least two input multiplexers and a plurality of output data lines individually connected to at least two output multiplexers.

33. A barrel shifter configured to provide bidirectional shifting of a bit pattern, comprising:

an input operable to receive the bit pattern and at least one control signal;

a decoder configured to generate at least one select signal responsive to the at least one control signal;

an input bit-reverser configured to selectively reverse the bit pattern responsive to at least one control signal, the input bit-reverser including a plurality of input multiplexers;

a shifter configured to left shift the bit pattern subsequent to the reversal thereof and responsive to at least one select signal, the shifter being configured to vary the magnitude of the shift of the bit pattern responsive to at least one select signal, the shifter and the input bit-reverser being configured to provide a sign extension signal into the bit pattern;

an output bit-reverser configured to reverse the bit pattern subsequent to the shift thereof and responsive to at least one control signal, the output bit-reverser including a plurality of output multiplexers;

a plurality of input data lines individually connected to at least two input multiplexers and a plurality of output data lines individually connected to at least two output multiplexers; and a data output operable to output the bit pattern.

34. A method of manipulating bit patterns comprising steps of:

receiving a plurality of bit patterns;

receiving a plurality of control signals;

first transposing the bit patterns;

shifting the bit patterns following the first transposing thereof, the shifing including shifting all bit patterns individually in a single shiftting operation;

varying the magnitude of the shifting responsive to the control signals; and second transposing the bit patterns following the shifting thereof.

35. The method according to claim 34 wherein the shifting includes left shifting the bit patterns.

36. The method according to claim 34 further comprising outputting the bit patterns.

37. The method according to claim 34 wherein the shifting and the transposings are responsive to the control signals.

38. The method according to claim 34 further comprising providing a plurality of sign extension signals into respective bit patterns during at least one of the first transposing and the shifting.

39. A method of manipulating a bit pattern comprising steps of:

receiving a bit pattern;

first transposing the bit pattern;

shifting the bit pattern following the first transposing thereof;

second transposing the bit pattern following the shifting thereof; and providing a sign extension signal into the bit pattern during at least one of the first transposing and the shifting.

40. The method according to claim 39 wherein the applying comprises applying during the first transposing and the shifting.

41. The method according to claim 39 wherein the shifting includes left shifting the bit pattern.

42. The method according to claim 39 further comprising outputting the bit pattern.

43. The method according to claim 39 further comprising receiving a plurality of control signals and the shifting and the transposings are responsive to the control signals.

* * * * *

UNITED STATES PATENT AND TRADEMARK OFFICE
CERTIFICATE OF CORRECTION

PATENT NO. : 5,995,579
DATED : November 30, 1999
INVENTOR(S) : Christophe Vatinel It is certified that error appears in the above-identified patent and that said Letters Patent is hereby corrected as shown below:

Col. 9, ln. 31: Replace "according to claim 2" with --according to claim 3--.

Col. 12, ln. 12: Replace "shifing" with --shifting--.

Col. 12, ln. 13: Replace "shiftting" with --shifting--.

Signed and Sealed this

Eighth Day of August, 2000

Attest:

Q. TODD DICKINSON

*Attesting Officer*            *Director of Patents and Trademarks*

UNITED STATES PATENT AND TRADEMARK OFFICE
CERTIFICATE OF CORRECTION

PATENT NO : 5,995,579
DATED : November 30, 1999
INVENTOR(S) : Christophe Vatinel It is certified that error appears in the above-identified patent and that said Letters Patent is hereby corrected as shown below:

On title page, item 75 Inventor
replace "Christopher"
with --Christophe--.

Signed and Sealed this

Sixth Day of March, 2001

*Attest:*

NICHOLAS P. GODICI

*Attesting Officer*  *Acting Director of the United States Patent and Trademark Office*